United States Patent [19]

Runaldue et al.

[11] Patent Number: 5,479,649
[45] Date of Patent: Dec. 26, 1995

[54] METHOD AND APPARATUS FOR FORMING A LOGICAL COMBINATION OF SIGNALS FROM DIAGNOSTIC NODES IN AN IC CHIP FOR PASSIVE OBSERVATION AT A DEDICATED DIAGNOSTIC PIN

[75] Inventors: Thomas J. Runaldue, San Jose; Philip Ngai, Belmont, both of Calif.

[73] Assignee: Advanced Micro Devices, Inc., Sunnyvale, Calif.

[21] Appl. No.: 877,566

[22] Filed: May 1, 1992

[51] Int. Cl.⁶ .............................. G06F 11/32; G06F 11/00
[52] U.S. Cl. ...................... 371/22.1; 364/264.1; 364/266; 364/269.4; 364/259.6; 395/183.07
[58] Field of Search ...................................... 395/775, 700, 395/325, 650, 800, 575; 371/22.5, 22.6, 22.3, 22.1, 16.1

[56] References Cited

U.S. PATENT DOCUMENTS

| | | | |
|---|---|---|---|
| 3,825,901 | 7/1974 | Golnek, Sr. et al. | 340/172.5 |
| 4,267,463 | 5/1981 | Mayumi | 307/445 |
| 4,335,425 | 6/1982 | Goto et al. | 364/200 |
| 4,371,952 | 2/1983 | Schuck | 364/900 |
| 4,392,208 | 7/1983 | Burrows et al. | 364/900 |
| 4,703,484 | 10/1987 | Rolfe et al. | 371/22.3 |
| 4,752,729 | 6/1988 | Jackson et al. | 371/22.1 |
| 4,755,967 | 7/1988 | Gabris et al. | 364/900 |
| 4,876,645 | 10/1989 | Shioya et al. | 364/200 |
| 4,975,641 | 12/1990 | Tanaka et al. | 324/158 R |
| 4,995,038 | 2/1991 | Brown | 371/16.1 |
| 5,012,180 | 4/1991 | Dalrymple et al. | 371/22.6 |
| 5,030,904 | 7/1991 | Tonksalvala et al. | 324/158 R |
| 5,136,590 | 8/1992 | Polstra et al. | 371/16.2 |
| 5,144,230 | 9/1992 | Katoozi et al. | 371/22.6 |
| 5,157,781 | 10/1992 | Harwood et al. | 395/575 |
| 5,253,255 | 10/1993 | Carbine | 371/22.6 |

FOREIGN PATENT DOCUMENTS 60-13266   1/1985   Japan .

OTHER PUBLICATIONS

John F. Wakerly, Digital Design Principles and Practices, 1990, pp. 164, 294, 278.

Primary Examiner—Thomas C. Lee
Assistant Examiner—Marc K. Weinstein
Attorney, Agent, or Firm—Gerald M. Fisher

[57] ABSTRACT

Apparatus and method for programmably providing information on a dedicated output pin of an integrated circuit, which information is diagnostic about a plurality of nodes inside of said integrated circuit by connecting said plurality of nodes and a programmable set of binary gate signals to a combinatorial logic circuit and controlling the selection of said nodes being input to said logic circuit so that said combinatorial logic circuit provides a real time diagnostic signal to said dedicated output pin.

9 Claims, 5 Drawing Sheets

METHOD AND APPARATUS FOR FORMING A LOGICAL COMBINATION OF SIGNALS FROM DIAGNOSTIC NODES IN AN IC CHIP FOR PASSIVE OBSERVATION AT A DEDICATED DIAGNOSTIC PIN

FIELD OF THE INVENTION

This invention pertains to integrated circuit architecture and more particularly to network controller architecture which permits the user to program the functions of network system diagnostic circuitry.

BACKGROUND OF THE INVENTION

Integrated circuit design continues toward larger system or subsystem inclusion on a single silicon slab. The term "chip" is in common use to refer to the completed integrated circuit on a small silicon slab inside of a housing or package. As this trend continues, more and more sophisticated functions are being incorporated on a chip during its design. This trend has been further driven by the low cost, low power consumption and speed of CMOS structures so that almost any system which has a large enough market to justify the initial design costs is now being designed and supplied by these manufacturers who had earlier concentrated on manufacturing component type integrated circuits such as ROM, RAM, gates and registers.

As this trend has continued a great deal of the system design effort which was earlier being done by the manufacturer of end products has been moved to the chip designer and integrated circuit manufacturers.

In integrated circuit design there are many design constraints, one of the most important is the "pin out". Since a single high density integrated circuit die is generally on the order of one centimeter square, although it may contain hundreds of thousands of transistors and metal interconnections, there is only a limited area to which a self supporting wire lead can be connected to the chip without shorting together. This limits the number of integrated circuit input or output leads to approximately 200 with standard processing technology.

Accordingly, integrated circuit designers have to make many difficult decisions as to those discretionary functions will be taken out of the chip on a pin, i.e. in the "pin out" to be made available off chip. Included in this discretionary group are those signals providing system diagnostic functions. In the prior art, chip designers have had to decide how to share diagnostic functions and operational functions on a pin as well as how many pins to dedicate to diagnostics and which diagnostic signals were to be provided off chip through those pins. Network controller chips require so many required functions that discretionary diagnostics have been limited to only a few pins, i.e. 4–5. Accordingly, many diagnostic functions are not provided off chip on dedicated diagnostic pins and this has made trouble shooting and maintenance more difficult and expensive especially in those situations where the chip is interfacing with other equipment and the interconnecting chips and media could also be malfunctioning. In many instances diagnostic information, if it were available from the chip, could specifically isolate an off chip malfunction and avoid expensive downtime.

It is an object of this invention to increase the ability to obtain chip diagnostic information without increasing the pin out assigned to this function.

It is a still further object to provide users the ability to select the pin out diagnostic signals from a class of diagnostic signals.

It is a still further object to provide users the ability to program a chip with software to provide combinatorial logical functions to a selected class of diagnostic signals including delay and/or blinking functions in order to increase the users choice of diagnostic information without requiring a dedicated pin for each function.

SUMMARY OF THE INVENTION

Integrated circuits have only a limited number of pins which can be dedicated to a diagnostic function and there are many signals or functions which could be useful diagnostically if available outside of the chip. With our invention, we provide the ability to the chip user to program the installed chip via software techniques to logically combine/select diagnostic signals of the users choice as opposed to a fixed selection of diagnostic signals selected by the manufacturer.

DETAILED DESCRIPTION OF THE INVENTION

Many large scale integrated application circuits now include entire systems and frequently include microprocessors as a part of a chip. Other chips are designed with internal bus architecture and interfacing to standard buses of computer systems. Access to microprocesses bus structure provides the opportunity to program such chips with firmware or software under user control in ways not heretofore possible. For example, programming system status or self check diagnostics is now possible and theoretically if the chip were physically designed so as to make all its nodes available to detectors, a user could program a self check for every node, compare the result to a standard, and provide an error indicator of out of spec conditions and/or initiate a corrective action.

Although such diagnostics are theoretical possibilities, the practical size of an integrated circuit chip is limited by many factors having to do with basic silicon defect density and manufacturing yield. Yield decreases rapidly as a function of device density. Accordingly, chip designers, in general, have not implemented extensive self checks because of the number of interconnections required. However, some designers of large scale IC's have dedicated a few output pins to a selective choice of functions which those designers believed to be of interest to users. In some of those instances, chip designers have included internal drivers for powering display lights such as LED's to be indicative of selected functions.

We have determined that as systems became more dense and were packed on a single chip, it was becoming more difficult to isolate the source of malfunction because interconnection nodes were no longer available for diagnosis. Also, users are frequently interested, during operation, in different information from their chips than that provided by the manufacturers. Heretofore, internal circuit information was impossible to access if it were not designed to be made available on a dedicated output/input pin.

In our invention, we have provided a method and apparatus whereby a user can selectively access information about chip operations including diagnostic information without requiring an increase in the number of dedicated output pins. We provide a testing circuits including system of AND gates and OR gates which are coupled to any selected number of chip nodes and which can be combined under user software program control so that the combinatorial outputs are available on the dedicated output pins.

Figure 1:
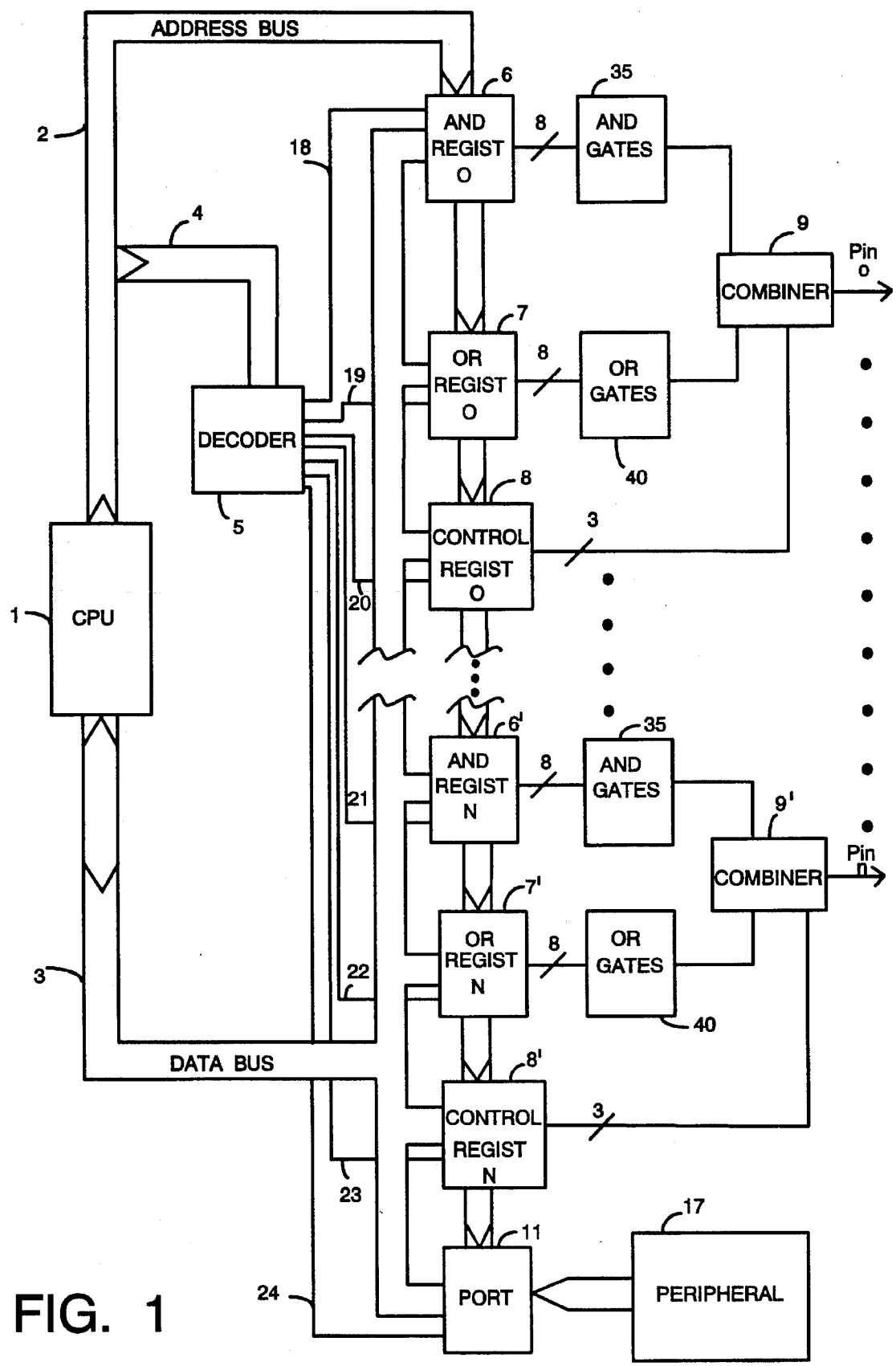
FIG. 1 is a block diagram disclosing one technique for programming the AND and OR Diagnostic Registers.

With reference to FIG. 1, we illustrate, in block diagram, test circuits for a user to program the chip node information which will be available on an output from the chip on the dedicated pins. Specifically, there is a bank of AND gates 35 and OR gates 40 for each of the dedicated pins for output diagnostics. In FIG. 1, this is illustrated as "N" pins. AND Register 6 is shown connected to AND Gates pin O element 35 and OR Register 7 is coupled to OR Gates pin O 40. AND gates 35 and OR gates 40 are connected to combiner 9, the output of which is provided to dedicated output pin O. Control register 8 is also connected to the combiner 9 as explained subsequently. Each of the AND Registers 6' and OR Registers 7' are connected to combiner 9' for each pin 1 through n. Also each register is connected to the address bus 2 and data bus 3 as well as to the decoder 5. Also shown is port 11 which provides an I/O port connection to the user peripheral 17. The port 11 is also connected to the address bus 2, data bus 3 and decoder 5. In the scheme illustrated, the CPU 1, under its program control, will accept the inputs from the peripheral 17 on port 11, having user specified values to be loaded into the AND Registers (elements 6 . . . 6') and OR Registers (elements 7 . . . 7'). The CPU will cause the user selected values to load into those registers. The configuration of FIG. 1 is illustrated in a memory mapped configuration for illustrative purposes. Any memory or port organization, i.e. I/O Busing or I/O ports which are integral with a CPU will also work to load a user selected value into the AND Registers and OR Registers.

With reference to FIG. 1, also shown is another set of registers for pins o through n, illustrated as Control Register 8 and Control Register N, 8'. The Control Registers (8 . . . 8') are also programmable via port 11 and peripheral 17 in the same manner as explained regarding AND Registers and OR Registers.

Figure 2:
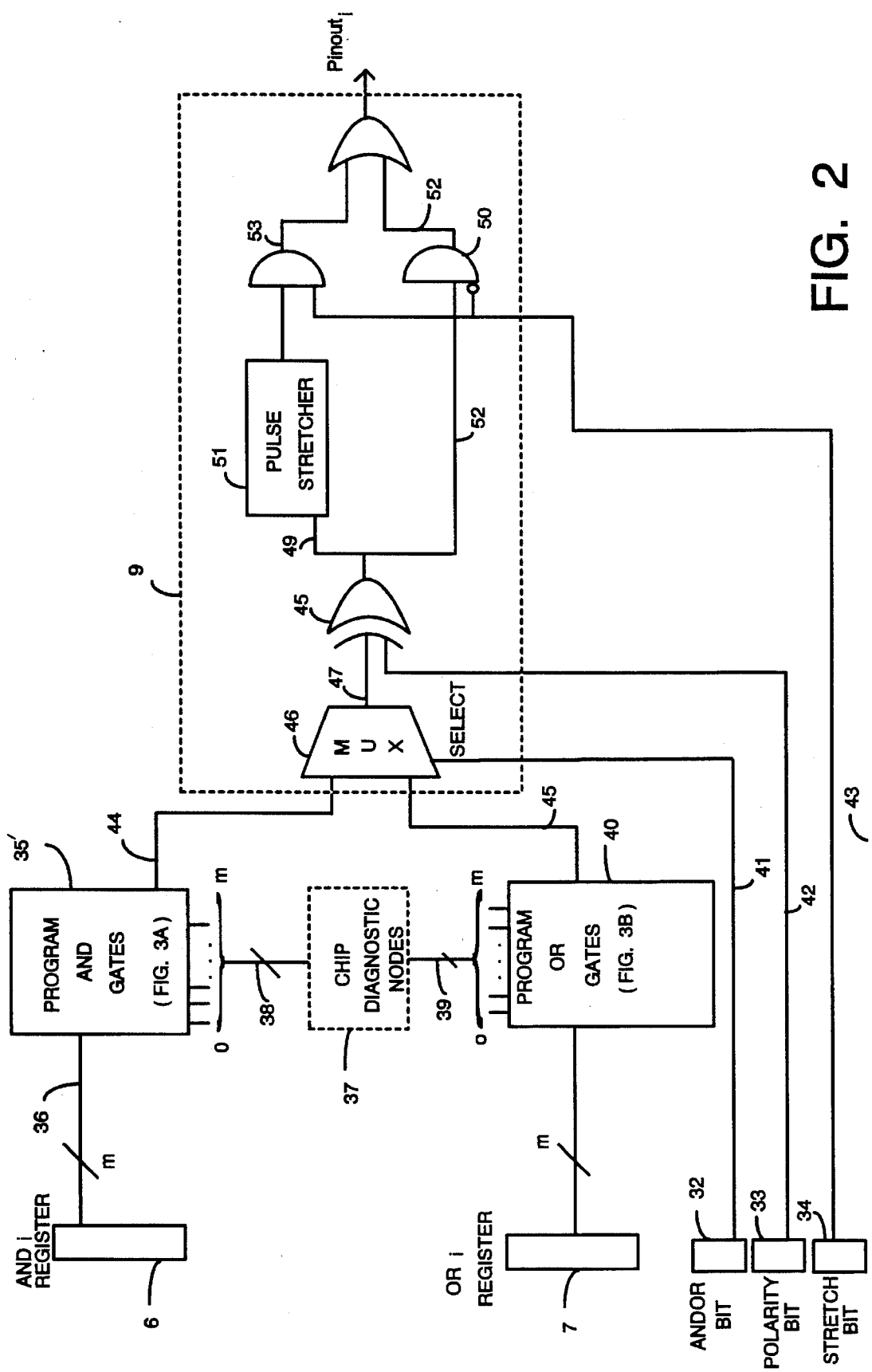
FIG. 2 is a block diagram of the circuit of one embodiment of a diagnostic channel.
Figure 3A:
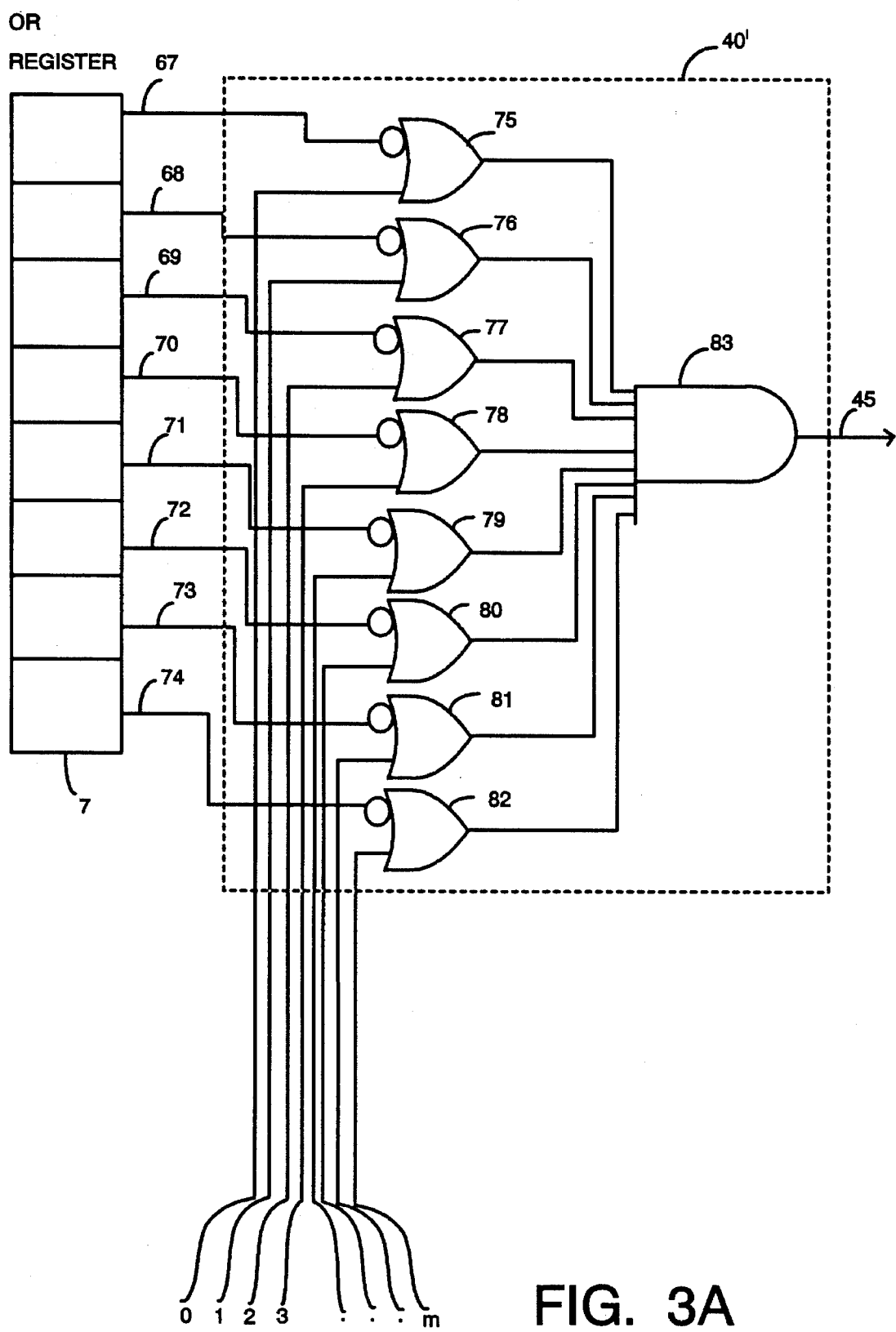
FIG. 3A is a schematic of the AND "Product of sums terms" Programmable Gate portion of FIG. 2.
Figure 3B:
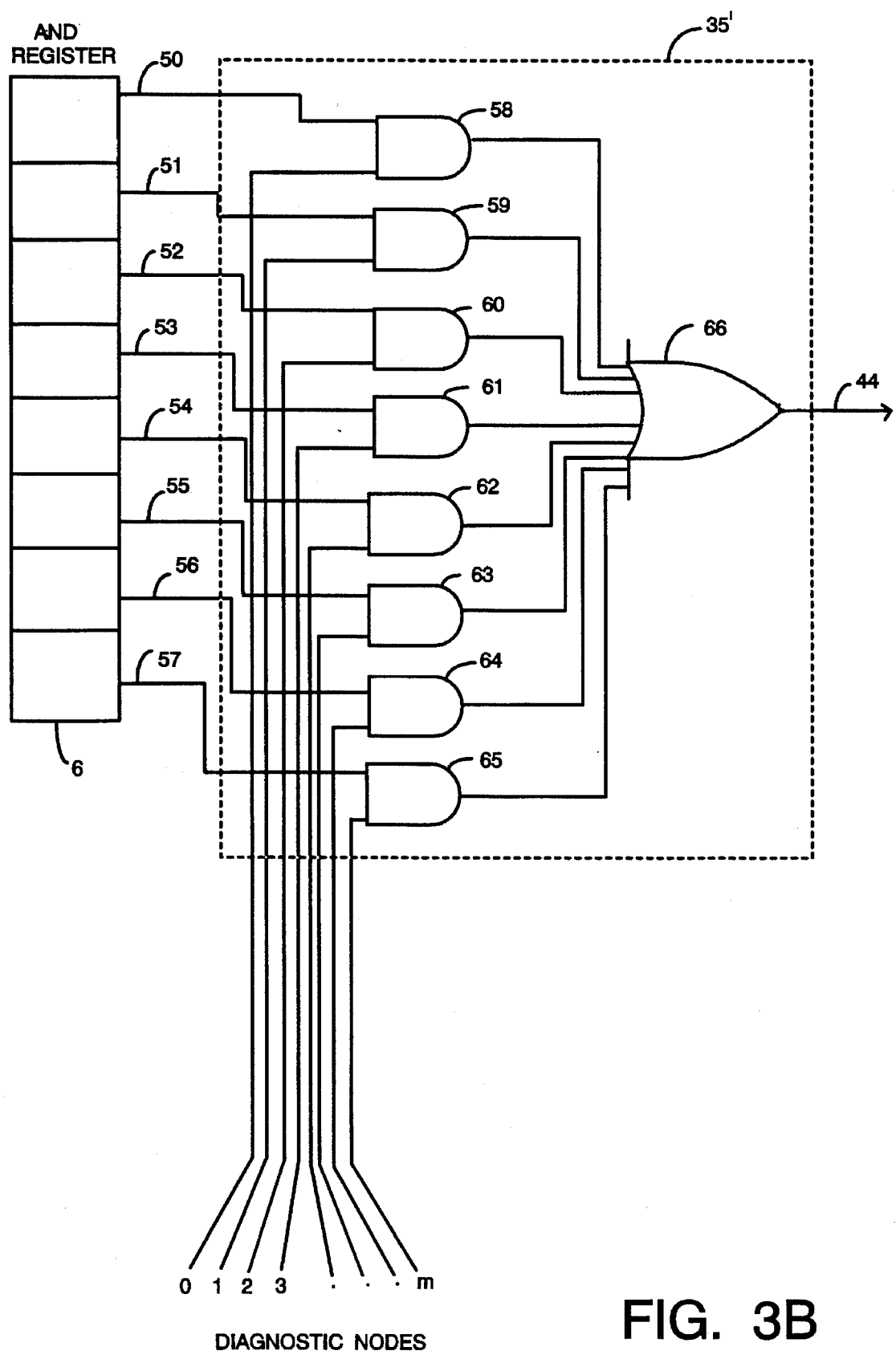
FIG. 3B is a schematic of the OR "sum of product terms" Programmable Gate portion of FIG. 2.

With reference to FIG. 2, the hardware interconnections to enable control of the diagnostic signal output for each of the dedicated pins is shown. The circuitry of FIG. 2 is identical for each of the "i" dedicated diagnostic pins. Specifically, the chip designer has provided metallization interconnection lines 38 on the chip connecting M nodes 37 of the operational circuits of the IC to be available for diagnosis to a block of programmable AND gates 35' and via M interconnection lines 39 to a block of programmable OR gates 40'. The Diagnostic Nodes are selected by the designer and can be defined as the logical intersection of the set of nodes of the operational circuits of the IC and the set of nodes of the diagnostic testing circuits. The chip designer has also provided metallization 36 on the chip connecting the outputs of each stage of the programmable AND Register 6 to the Programmable AND gates 35 and programmable OR Register 7 stage outputs to the Programmable OR gates 40'. The number of stages of the AND register 6 and OR register 7 must equal the number "m" of the Diagnostic Nodes made available for the "i" pin. With reference to FIG. 3B, the programmed AND Register 6 is shown connected via lines 50–57 to the Programmable AND gates block 35, each stage of the AND Register 6 being connected to a respective AND gate 58–65. A second input to each AND gate 58–65 are the Diagnostic Nodes O through M, each node O through M is coupled to a specific AND gate. If the user were to have programmed AND register 6 so that one of the register stages is a high, for example the first stage, and the remainder were programmed at a low value, then only AND gate 58 would respond, so that Diagnostic Node O would be the only state being designated to be monitored. The AND gates 58–65 are all connected to OR gate 66 and output on line 44. Similarly, with reference to FIG. 3A, OR Register 7 is shown connected to Programmable OR gates block 40'. Each of the OR Register stages output 67–74 are connected to OR gates 75–82 to the inverted input. The other input of the OR gates 752 are connected to the Diagnostic Nodes O through M selected by the chip designer. The OR gates 75–82 outputs are each connected to AND gate 83. The OR gate block permits the logical combination of a selected two or more of the Diagnostic Nodes at the output signal 45. For example, if the value programmed into the OR Register 7 sets all the stages at low except for the top two stages connected to OR gates 75 and 76 via connections 67 and 68, then the Diagnostic nodes 0 and 1 will be logically intersected. Output 45 will go high only if both Nodes 0 and 1 are high simultaneously.

With reference to FIG. 1 and FIG. 2, the functions of the set of Control Registers 8 . . . 8' (FIG. 1) and ANDOR bit 32, Polarity bit 33 and stretch bit 34 (FIG. 2) are explained. By setting the "Control Registers" for each of the dedicated bits, additional programmability is obtained. The first bit of Control Register 8' is set to enable selection of either the AND gate block 35' or the OR gate block 40'. This is shown on FIG. 2 as a Register ANDOR bit 32 connected to the MUX46 causing the MUX to switch its output between the lines 44 and 45. Similarly, the second bit of the Control Register is designated "polarity bit" 33 and it causes switching of polarity of the output by inverting the XOR circuit 48. Finally, the third bit of the Control Register is designated "Stretch bit" 34 which is connected to a pair of AND gates 49 and 50. When Stretch bit is low, AND gate 50 causes the signal from the XOR 48 to bypass the pulse stretcher 51 on line 52. If the Stretch bit 34 is high, the output of the XOR 48 is coupled through stretcher circuit 51 then to the output 53 to Pinout i. The stretcher function permits certain short duration pulses to be lengthened so that they may be visibly perceived by a human observer. In addition, the stretcher function can be configured for LED blinking excitation.

Figure 4:
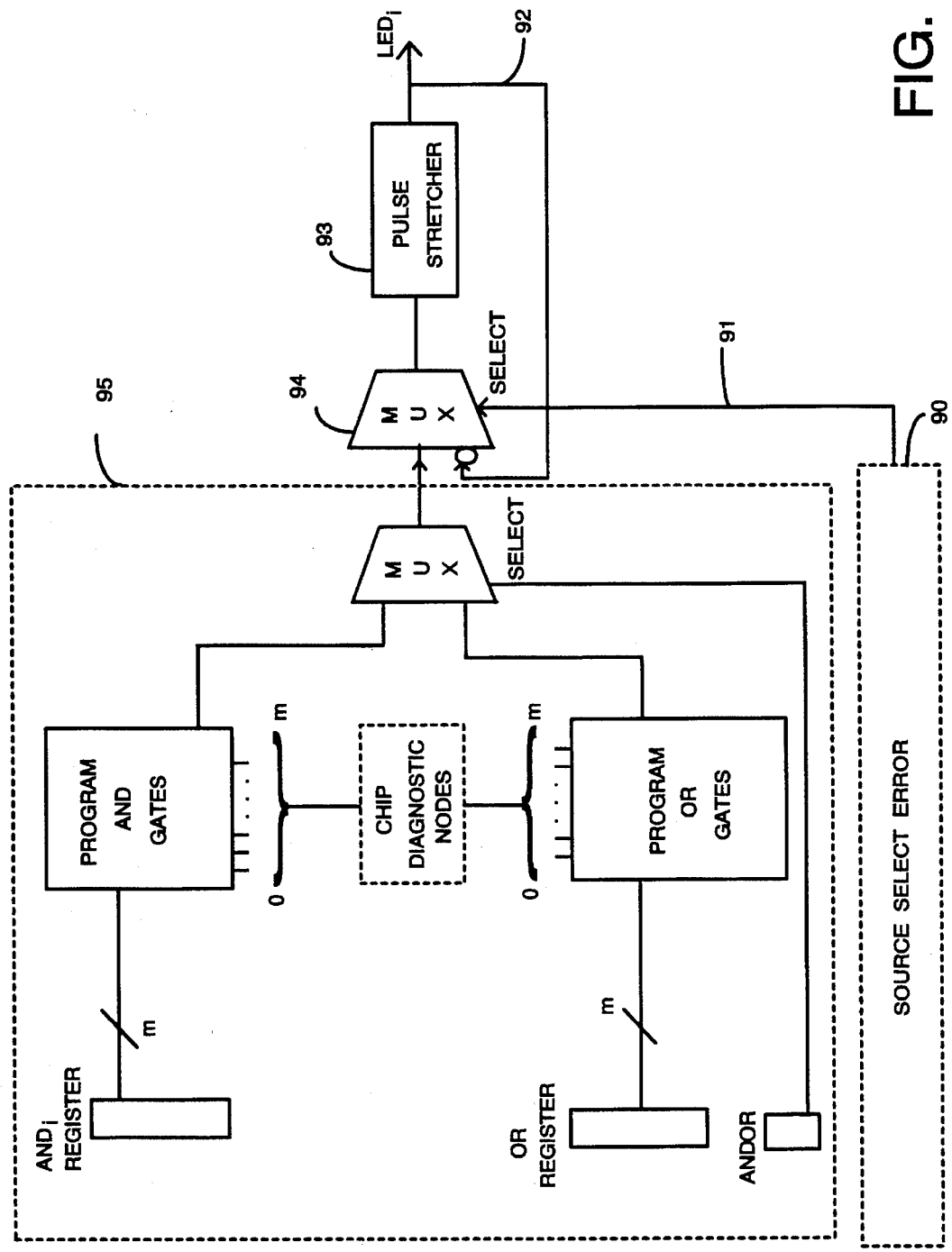
FIG. 4 is an alternative embodiment for combining programmable diagnostic node states with other overriding error programmable states to blink an alarm LED.

With reference to FIG. 4, another embodiment is disclosed which feeds the pulse stretcher 93 back via connection 92 to the MUX 94 on the non-selected inverted input. Whenever the block 90, a differently programmable block, similar to the source block 95, indicates an error, it would take over control via control line and causes the MUX 94 to feed back the pulse stretcher output to its input which would result in an oscillation which would cause an $LED_i$ to continually blink as an alarm indication.

The pulse stretch 51 and 93 could be as simple as a divider circuit such as a ripple counter described in "Logic Design with Integrated Circuits," by William Wickes, John Wiley and Sons, 1968, at page 198. Alternatively, the pulse stretcher could have programmable on and off times.

This invention finds particular application in an Ethernet network controller chip where it is desirable to have network status activities displayed with LEDs. There are six primary network indicators called Collision, Jabber, Link Status, Receive, Receive Polarity and Transmit and several other secondary indicators. Through use of the invention, the user can select the logical combination desired of all of these indicators without increasing the diagnostic pinout.

The embodiments described of this invention have been for descriptive and illustrative purposes and it is the intention that the scope of this invention shall be determined by the claims.

With this in view what is claimed is:

1. An integrated circuit (IC) comprising:

(a) an integrated circuit (IC) chip, said IC chip having a housing, said housing having a first plurality of metal conducting pins, each said pin being supported by said housing and insulated by said housing from contact with any other pin and wherein each pin extends from the interior of said housing to the exterior of said housing and wherein each said pin is electrically coupled to a node of said IC chip, said plurality of pins includes a first plurality of pins dedicated to interconnection required for coupling operation functions of said IC chip to the environment external to said IC chip and a second plurality of pins equal to n which are dedicated solely to passive observation of interior node signals providing diagnostic information regarding the internal operation of said IC chips, where n is an integer which is less than said first plurality of said metal conducting pins;

(b) a combinatorial logic array, said combinatorial logic array including M AND gate arrays and M OR gate arrays, each said AND gate array having a single output terminal and each OR gate array having a single output terminal, said combinatorial logic array being a portion of said IC where M is a predetermined integer greater than zero;

(c) M combiner circuits, each said combiner circuit having an input and an output, said combiner circuit input being connected to one said AND gate single output terminal and one said OR gate single output terminal and each said combiner circuit output being coupled to a said pin dedicated to providing diagnostic information;

(d) a plurality of programmable registers, each said programmable register having an input and an output, each said AND gate array being connected to the output of a predetermined one of said plurality of programmable registers for programming said AND gate array, each said OR gate array being connected to the output of a predetermined one of said plurality of programmable registers for programming said OR gate array:

(e) metallization connections between a plurality of said interior nodes of said IC chips to said AND gate arrays for diagnostics;

(f) metallization connections between a plurality of said interior nodes of said IC chip to said OR gate arrays for diagnostics; and (g) means, in operation, for causing each said combiner circuit to select either the OR gate array output or the AND gate array output and to direct said selected array output toward said combiner output.

2. A passive method for observing signals at nodes in an integrated circuit (IC) for providing diagnostic information about said IC on a silicon chip comprising:

providing an output pin from said silicon chip which is solely dedicated to observational diagnostic analysis relating to said IC;

fixedly electrically connecting the signals on M different nodes in said integrated circuit in one-to-one corresponding basis to different input nodes in a dedicated diagnostic combinatorial logic circuit in said chip, wherein M is a predetermined integer greater than zero;

fixedly electrically connecting programmable selectable outputs of M register stages to said combinatorial logic circuit;

gating said signals from said IC nodes responsive to said selectable outputs of said M register stages to generate a single real time signal from said signals on M different nodes and connecting said single real time signal to said diagnosis dedicated output pin where said single real time signal is a logical combination of the signals on said IC nodes which have been selected by said M register stages for logical combination;

wherein said step of gating said multiple number of signals includes logical OR sum of product operations and logical AND product of sums operations;

wherein said step of gating includes programmable selecting either said logical OR sum of product operations or said logic AND product of sums operation as said single real time signal to connect to said dedicated output pin;

wherein said step of connecting said real time signal to said dedicated output pin includes alternatively passing said real time signal through a pulse stretcher to lengthen short duration pulses so that they may be perceived in real time by a human observer.

3. An integrated circuit (IC) device comprising:

a housing; a chip containing said IC; said IC having operational circuits having electrical nodes and testing circuits having electrical nodes, where said electrical nodes of said operational circuits are distinct from said electrical nodes of said testing circuits except for chip diagnostic nodes, said chip diagnostic nodes being the logical intersection of the set of electrical nodes of the operational circuits and the electrical nodes of the testing circuits, said housing supporting said chip;

metal conducting pins, said metal conducting pins being electrically connected to said electrical nodes of said operational circuits of said IC, said pins being physically separated and supported by said housing, at least one of said pins being dedicated to providing diagnostic information;

said testing circuits including combinatorial logic circuits; a plurality of said electrical nodes of said operational circuits of said IC being said chip diagnostic nodes, said chip diagnostic nodes being permanently electrically connected for selective passive diagnosis to said combinatorial logic circuits;

said testing circuit further including a plurality of programmable register stages having inputs and outputs, said programmable register stage outputs being hardwired to said combinatorial logic circuit for controlling the selection of said plurality of chip diagnostic nodes for forming a logical combination of the signals on said chip diagnostic nodes to form a combination logic signal before forwarding said combination logic signal to said at least one said dedicated diagnostic pin;

CPU means to load a program into said programmable register stages;

said combinatorial logic circuit includes a plurality of AND gates, each said AND gate having a first and second input, where said first input of each of said AND gates is coupled to a different one of said plurality of chip diagnostic nodes and where each said second input of said AND gates is coupled to a different one of said hardwired programmable register stage.

4. The IC of claim 3 wherein said combinatorial logic circuit includes a plurality of OR gates wherein each said OR gate includes two inputs.

5. The IC of claim 4 wherein each said AND gate has one output and each said OR gate has one output.

6. The IC of claim 5 wherein said OR gate output and said AND gate output are connected to the input of a combiner.

7. The IC of claim 6 wherein said combiner includes a MUX wherein said MUX selects either said OR gate output or said AND gate output signal to forward toward said dedicated pin.

8. The IC of claim 3 including an XOR gate, and wherein each said AND gate output is coupled to said XOR gate.

9. The IC of claim 8 wherein said XOR gate output is coupled to a switching circuit for providing a visible blinking output signal on said dedicated diagnostic output pin.

* * * * *